United States Patent
Sasaki et al.

(10) Patent No.: US 10,141,164 B2
(45) Date of Patent: Nov. 27, 2018

(54) PLASMA PROCESSING APPARATUS AND PLASMA PROCESSING METHOD

(71) Applicant: TOKYO ELECTRON LIMITED, Tokyo (JP)

(72) Inventors: Yasuharu Sasaki, Miyagi (JP); Akihito Fushimi, Miyagi (JP); Manabu Iwata, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 318 days.

(21) Appl. No.: 14/494,822

(22) Filed: Sep. 24, 2014

(65) Prior Publication Data
US 2015/0090692 A1    Apr. 2, 2015

(30) Foreign Application Priority Data

Sep. 27, 2013   (JP) .................. 2013-201802

(51) Int. Cl.
| | | |
|---|---|---|
| C23C 16/505 | (2006.01) | |
| H01J 37/32 | (2006.01) | |
| C23C 16/458 | (2006.01) | |
| C23C 16/46 | (2006.01) | |

(52) U.S. Cl.
CPC .... H01J 37/32449 (2013.01); C23C 16/4586 (2013.01); C23C 16/463 (2013.01); C23C 16/466 (2013.01); C23C 16/505 (2013.01); H01J 37/32715 (2013.01); H01J 37/32724 (2013.01)

(58) Field of Classification Search
CPC ... C23C 16/505; C23C 16/463; C23C 16/466; C23C 16/4586; H01J 37/32724

USPC ........... 156/345.48, 345.51, 345.52, 345.53; 216/71

See application file for complete search history.

(56) References Cited

U.S. PATENT DOCUMENTS

| | | | | |
|---|---|---|---|---|
| 7,235,137 B2* | 6/2007 | Kitayama | ............... | C30B 31/14 118/712 |
| 2005/0051098 A1* | 3/2005 | Aramaki | ............. | C23C 16/4581 118/728 |
| 2008/0289767 A1* | 11/2008 | Tandou | ............. | H01J 37/32431 156/345.53 |
| 2012/0080101 A1* | 4/2012 | Tatarek | ................ | G05D 16/103 137/343 |
| 2012/0160808 A1* | 6/2012 | Kikuchi | ............ | H01J 37/32165 216/67 |

FOREIGN PATENT DOCUMENTS

JP        11-31680 A    2/1999

* cited by examiner

*Primary Examiner* — Binh X Tran
(74) *Attorney, Agent, or Firm* — Rothwell, Figg, Ernst & Manbeck, P.C.

(57) ABSTRACT

A plasma processing apparatus and a plasma processing method are provided which can sufficiently suppress an abnormal discharge in a gas space. A plasma processing apparatus includes a high frequency power source connected between a processing chamber and a base stand; a gas storage unit provided within the base stand and configured to store a gas; a blocking mechanism configured to block a gas introducing port of the gas storage unit; and a connection unit configured to connect a space between a disposition position of a wafer and the base stand, to the gas storage unit.

4 Claims, 7 Drawing Sheets

PLASMA PROCESSING APPARATUS AND PLASMA PROCESSING METHOD

CROSS-REFERENCE TO RELATED APPLICATIONS

This application is based on and claims priority from Japanese Patent Application No. 2013-201802, filed on Sep. 27, 2013, with the Japan Patent Office, the disclosure of which is incorporated herein in its entirety by reference.

TECHNICAL FIELD

The present disclosure relates to a plasma processing apparatus and a plasma processing method.

BACKGROUND

In a plasma processing apparatus, the temperature of a substrate to be processed is increased by a plasma processing. Therefore, a base stand that supports the substrate is cooled by cooling water, and cooling gas is supplied to a gap between the substrate and the base stand. However, in a gas space including a supply path of the cooling gas, an abnormal discharge may easily occur due to a high frequency voltage applied at the plasma processing. When such abnormal discharge occurs, the plasma processing may not be stably performed.

Japanese Patent Laid-Open Publication No. H11-31680 discloses a plasma processing apparatus which employs a unique structure in a gas space so as to suppress the abnormal discharge. According to the unique structure, the electric field strength of a gas supply path may be weakened.

SUMMARY

The present disclosure provides a plasma processing apparatus which includes: a high frequency power source connected between a reference electrode and a base stand; a gas storage unit provided within the base stand and configured to store a gas; a blocking mechanism configured to block a gas introducing port of the gas storage unit; and a connection unit configured to connect a space between a disposition position of a substrate and the base stand, to the gas storage unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
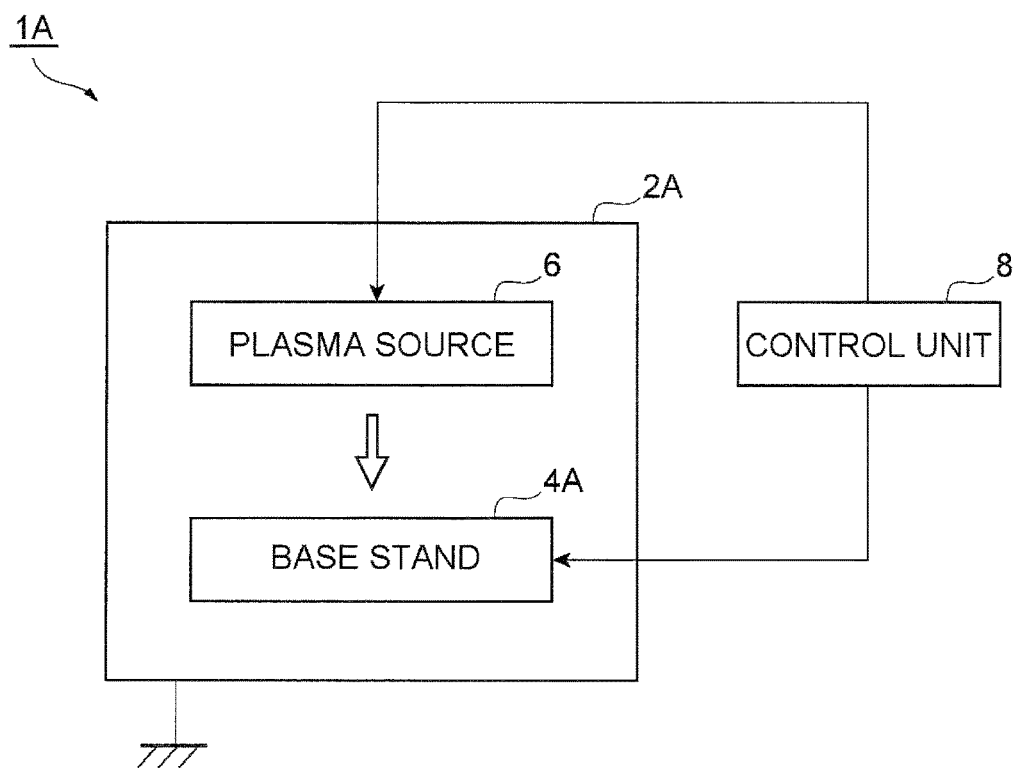
FIG. 1 is a block diagram of a plasma processing apparatus in a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There has been a limitation in the electric field strength which suppresses electric discharge, and the plasma processing apparatus disclosed in Japanese Patent Laid-Open Publication No. H11-31680 cannot sufficiently suppress an abnormal discharge.

Accordingly, in the field of the present technology, a plasma processing apparatus and a plasma processing method are required to sufficiently suppress an abnormal discharge in a gas space.

According to an aspect of the present disclosure, a plasma processing apparatus includes: a high frequency power source connected between a reference electrode and a base stand; a gas storage unit provided within the base stand and configured to store a gas; a blocking mechanism configured to block a gas introducing port of the gas storage unit; and a connection unit configured to connect a space between a disposition position of a substrate and the base stand, to the gas storage unit.

According to the plasma processing apparatus, the gas introducing port of the gas storage unit is blocked so as to confine the gas within the base stand. Thus, even when a high frequency voltage is applied between the reference electrode and the base stand, the entirety of the gas is kept at the same potential as the base stand. As described above, since no potential difference occurs in the gas space, an abnormal discharge may be sufficiently suppressed in the gas space.

The gas storage unit preferably includes a pressure fluctuation suppressing mechanism configured to suppress pressure fluctuation of the gas in the gas storage unit. In this case, even when the gas is leaked from the space between the disposition position of the substrate and the base stand, the gas pressure may be constantly maintained.

According to an aspect of the present disclosure, the plasma processing apparatus further includes a control unit. The control unit preferably introduces the gas into the gas storage unit when a high frequency voltage is not applied between the reference electrode and the base stand by the high frequency power source. Here, since the gas is introduced into the gas storage unit when the high frequency voltage is not applied, the gas may be introduced into the gas storage unit without an abnormal discharge.

According to an aspect of the present disclosure, a plasma processing method includes: introducing a gas into a gas storage unit when a high frequency voltage is not applied between a reference electrode and a base stand by a high frequency power source, the gas storage unit being provided within the base stand and connected to a space between a disposition position of a substrate and the base stand, and blocking a gas introducing port of the gas storage unit when the high frequency voltage is applied between the reference electrode and the base stand by the high frequency power source.

According to the plasma processing method, when the high frequency voltage is not applied between the reference electrode and the base stand, the gas is introduced into the gas storage unit, and when the high frequency voltage is applied between the reference electrode and the base stand, the gas introducing port of the gas storage unit is blocked to confine the gas within the base stand. Accordingly, even when the high frequency voltage is applied, the entirety of the gas is kept at the same potential as the base stand. As described above, in the gas space, no potential difference occurs, and thus abnormal discharge may be sufficiently suppressed in the gas space.

According to the plasma processing apparatus and the plasma processing method of the present disclosure, the abnormal discharge in the gas space may be sufficiently suppressed.

Hereinafter, various exemplary embodiments will be described in detail with reference to the accompanying drawings. The same or corresponding parts in the drawings are denoted with the same reference numerals, and repetitive descriptions thereof will be omitted.

First Exemplary Embodiment

First, a plasma processing apparatus 1A in the first exemplary embodiment will be described. FIG. 1 is a block diagram of the plasma processing apparatus 1A in the first exemplary embodiment.

The plasma processing apparatus 1A illustrated in FIG. 1 includes a processing chamber 2A which is formed in a substantially cylindrical shape. The processing chamber 2A is made of, for example, aluminum alloy, and is electrically grounded. The processing chamber 2A serves as a reference electrode. The inner wall surface of the processing chamber 2A is alumite-processed. Also, the inner wall surface of the processing chamber 2A may be covered with yttrium oxide. The processing chamber 2A defines a processing space where plasma is generated.

A base stand 4A is provided within the processing chamber 2A. The base stand 4A will be described later.

A plasma source 6 is provided above the base stand 4A within the processing chamber 2A. The plasma source 6 may use, for example, the ICP (Inductively Coupled Plasma). Also, the plasma source 6 may use a plasma source with an electron density of the order of $10^{10}$ to $10^{12}$, for example, the ECR (Electron Cyclotron Resonance) or microwaves. Also, the plasma source 6 may be a plasma source such as the CCP (Capacitively Coupled Plasma), and may be configured to supply microwaves to a radial line slot antenna so as to generate a surface wave plasma in the vicinity of a dielectric window disposed to face the radial line slot antenna.

The plasma processing apparatus 1A further includes a control unit 8. The control unit 8 may be a computer device which includes an input device such as a keyboard, a storage device including various recipes and control programs, and a central processing unit. The control unit 8 is connected to each of the base stand 4A and the plasma source 6, and sends control signals.

Figure 2:
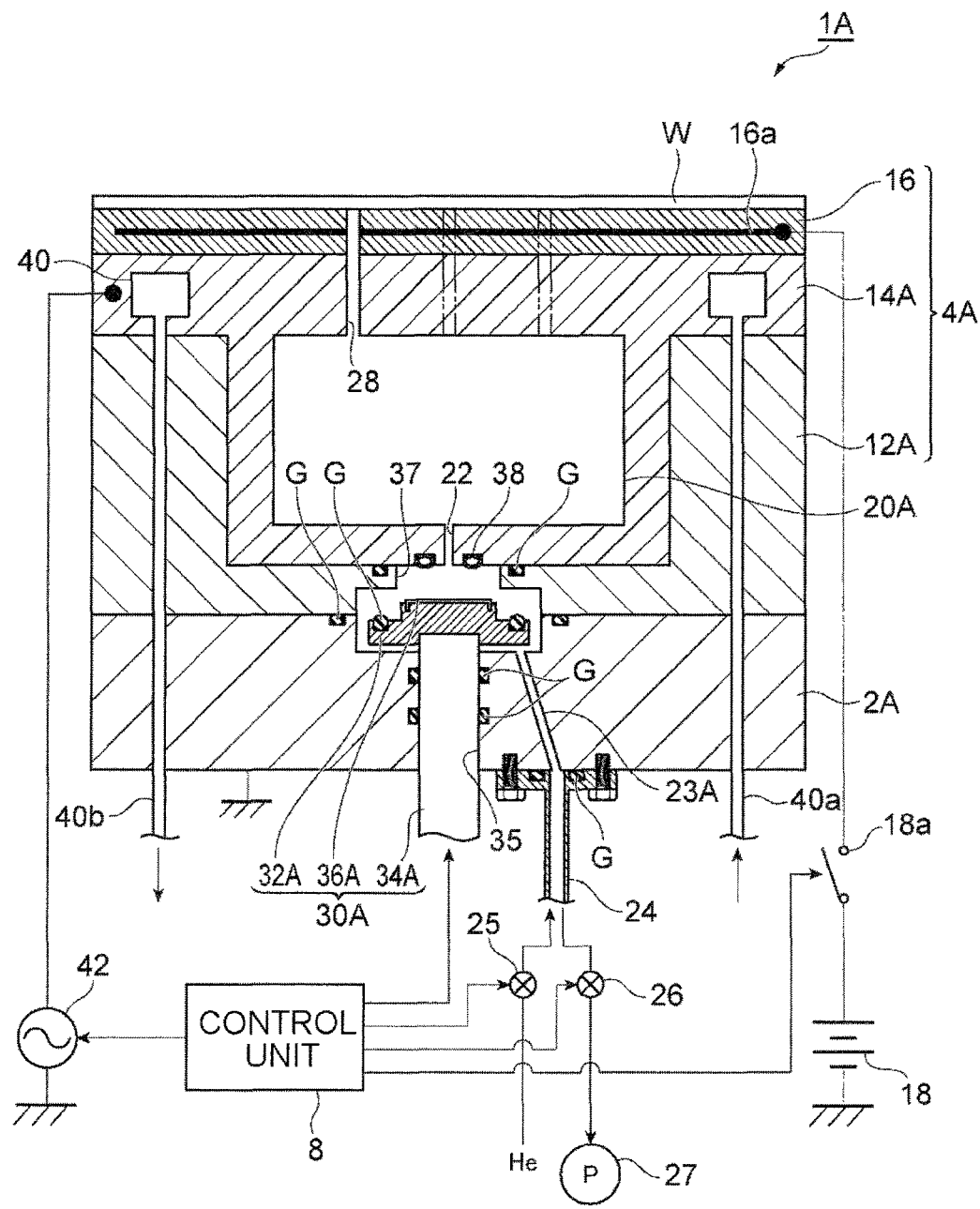
FIG. 2 is a cross-sectional view schematically illustrating a part of the plasma processing apparatus.

Hereinafter, the configuration of the base stand 4A will be described in detail. FIG. 2 is a cross-sectional view schematically illustrating a part of the plasma processing apparatus 1A. The base stand 4A includes a holding unit 12A, a base 14A, and an electrostatic chuck 16 in this order, on the inner wall surface of a bottom portion of the processing chamber 2A.

The holding unit 12A is made of, for example, an insulating material such as ceramic, and is formed in a cylindrical shape having a bottom portion. The holding unit 12A holds the bottom portion of the base 14A such that the bottom portion is fitted in the cylinder.

The base 14A is made of, for example, aluminum, and is formed in a disk shape, and constitutes an electrode. The electrostatic chuck 16 includes an electrode film 16a provided as an inner layer of an insulating film. The electrode film 16a is electrically connected to a DC power supply 18 through a switch 18a. The electrostatic chuck 16 generates the Coulomb force by a DC voltage applied to the electrode film 16a from the DC power supply 18, and is configured to suck a substrate (hereinafter, referred to as a "wafer") W which is an object to be processed, by the Coulomb force.

A gas storage unit 20A is provided within the base 14A. The gas storage unit 20A stores a cooling gas such as a He gas. The gas storage unit 20A includes a gas introducing port 22 configured to introduce the cooling gas. The gas introducing port 22 is connected to and communicated with a gas introducing line 23A penetrating the bottom portion of the processing chamber 2A, and the bottom portion of the holding unit 12A. The gas introducing line 23A is connected to and communicated with a gas pipe 24 which is fixed to the outer surface of the bottom portion of the processing chamber 2A by bolts. Accordingly, the cooling gas is introduced to the gas storage unit 20A through the gas pipe 24, the gas introducing line 23A, and the gas introducing port 22 from the outside of the processing chamber 2A. The gas pipe 24 is provided with a first valve 25 configured to control a supply amount of the cooling gas. The gas pipe 24 is further provided with a second valve 26, and is connected to and communicated with a vacuum pump 27 through the second valve 26.

In the gas storage unit 20A, a plurality of connection units 28 is provided to connect a space between a disposition position of the wafer W and the electrostatic chuck 16 to the gas storage unit 20A. The connection units 28 supply the cooling gas stored in the gas storage unit 20A to the space between the wafer W and the top surface of the electrostatic chuck 16. The cooling gas effectively transfers the heat of the wafer W to the electrostatic chuck 16.

In the space of the gas introducing line 23A at the gas introducing port 22 side, a blocking mechanism 30A configured to block the gas introducing port 22 is provided. The blocking mechanism 30A includes a disk-shaped sealing valve 32A having a convex portion at the center of the top surface thereof, a driving shaft 34A fixed to the sealing valve 32A and configured to raise and lower the sealing valve 32A, and a metal contact plate 36A provided on the convex portion at the center of the top surface of the sealing valve 32A. The sealing valve 32A seals the gas introducing port 22 by fitting the convex portion at the center of the top surface into a through hole 37. The through hole 37 is formed in the bottom portion of the holding unit 12A which faces the convex portion. The through hole 37 is a part of the gas introducing line 23A. The driving shaft 34A is provided within the through hole 35 formed in the processing chamber 2A so as to be raised and lowered. The metal contact plate 36A comes in a metal touch with a metal seal 38 provided on the outer surface of the bottom portion of the base 14A which faces the metal contact plate 36A. The metal seal 38 is provided to surround the gas introducing port 22.

Gaskets G made of an insulating material such as, for example, rubber, are provided in the through hole 35 to maintain a sealing property of a bonding surface between the through hole 35 and the driving shaft 34A. The gaskets G are provided such that the driving shaft 34A is slidably maintained. Further, a gasket G is provided on each of a bonding surface between the outer surface of the bottom portion of the processing chamber 2A and the gas pipe 24, a bonding surface between the processing chamber 2A and the holding unit 12A, a bonding surface between the holding unit 12A and the base 14A, and a bonding surface between the sealing valve 32A and the holding unit 12A.

An annular coolant chamber 40 extending in, for example, the circumferential direction is formed within the base 14A. The coolant chamber 40 is connected to a chiller unit (not illustrated) provided at the outside of the processing chamber 2A through pipes 40a and 40b. A refrigerant such as, for example, refrigerant liquid or cooling water, is supplied to the coolant chamber 40 to be circulated therein. Accordingly, the base 14A cools the wafer W through the electrostatic chuck 16.

A high frequency power source 42 is electrically connected between the base 14A and GND. The high frequency power source 42 generates a high frequency power for attracting ions. The high frequency power source 42 applies a high frequency voltage having a high frequency (e.g., 27 MHz or more) suitable for attracting ions, to the base 14A. Thus, when the high frequency voltage is applied, the processing chamber 2A becomes a GND portion, and the base 14A becomes an RF-HOT portion. The holding unit 12A is an insulating portion.

The control unit 8 is connected to the switch 18a, the first valve 25, the second valve 26, a motor for moving the driving shaft 34A, and the high frequency power source 42, and sends control signals to these parts, respectively. By the control signals from the control unit 8, opening and closing of the switch 18a, opening and closing of the first valve 25, opening and closing of the second valve 26, raising and lowering of the driving shaft 34A, and supply of the high frequency voltage from the high frequency power source 42 are controlled.

Figure 3:
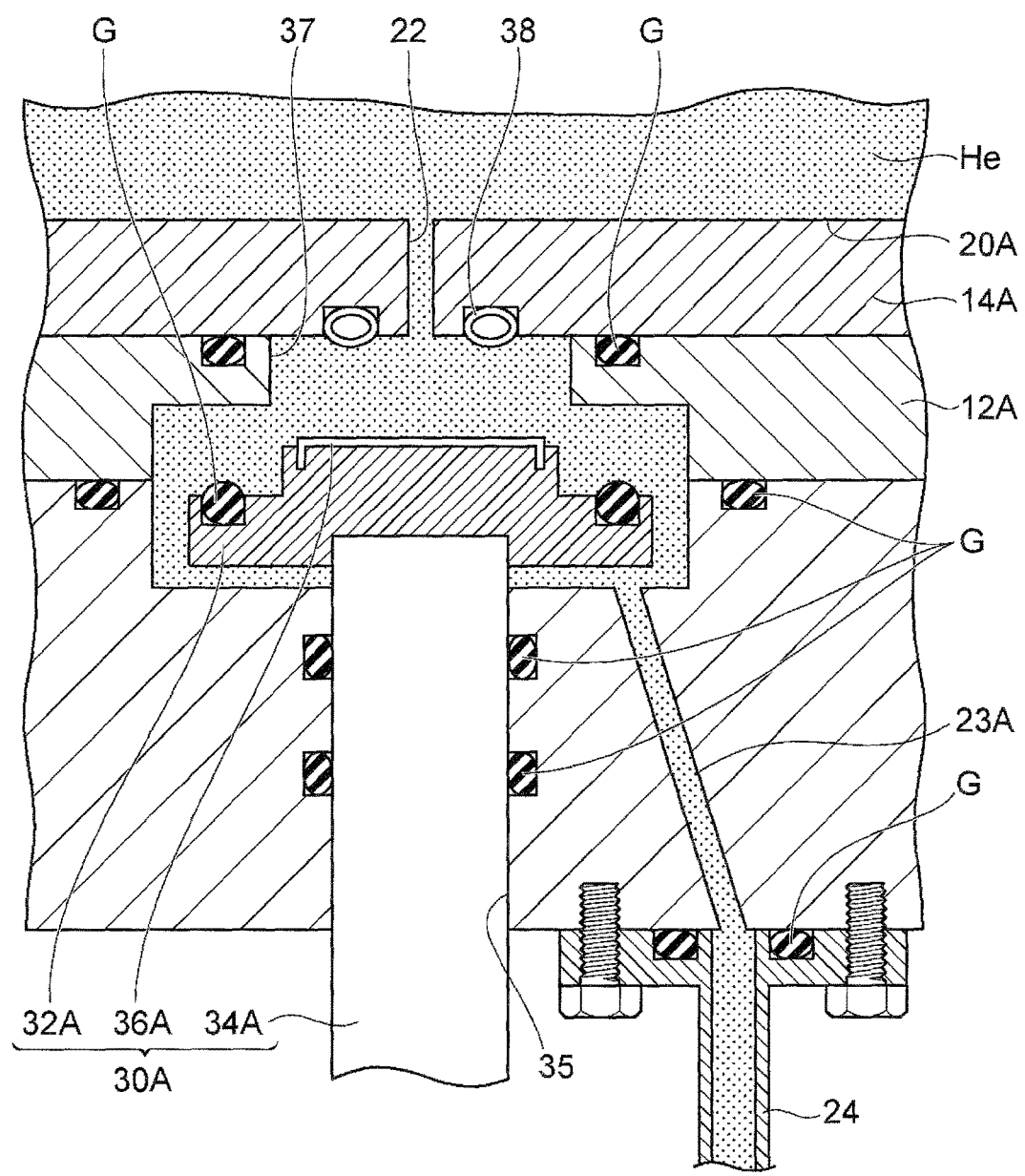
FIG. 3 is a cross-sectional view illustrating a structure in the vicinity of a blocking mechanism in an enlarged scale when the blocking mechanism is in an opened state.
Figure 4:
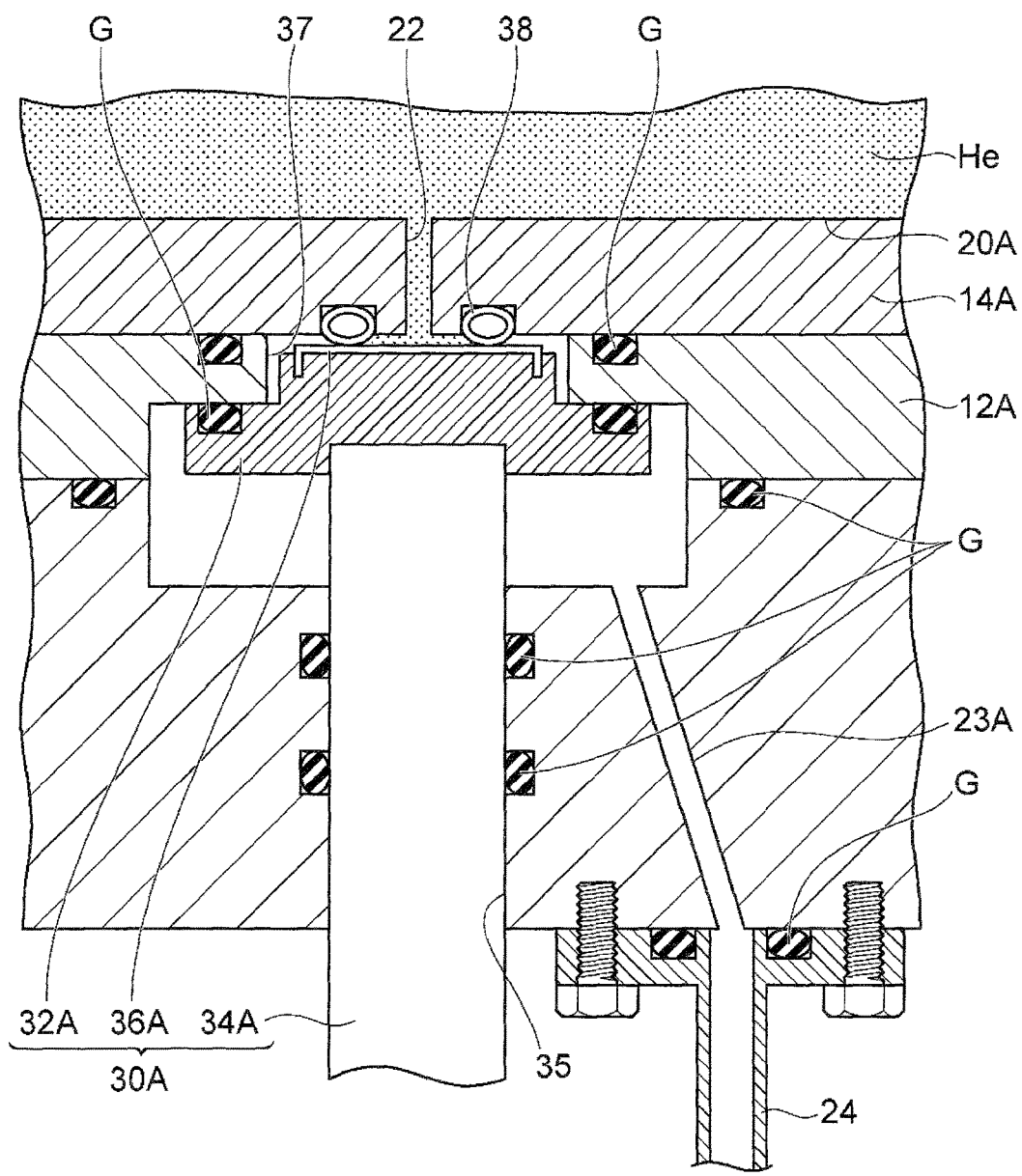
FIG. 4 is a cross-sectional view illustrating a structure in the vicinity of the blocking mechanism in an enlarged scale when the blocking mechanism is in a closed state.

Hereinafter, a specific example of a control in the base stand 4A of the plasma processing apparatus will be described with reference to FIGS. 1 to 4. In FIGS. 3 and 4, the portion where a He gas is present is illustrated with hatching. FIG. 3 is a cross-sectional view illustrating a structure in the vicinity of the blocking mechanism 30A in an enlarged scale when the blocking mechanism 30A is in an opened state, and FIG. 4 is a cross-sectional view illustrating a structure in the vicinity of the blocking mechanism 30A in an enlarged scale when the blocking mechanism 30A is in a closed state. At the time of control start, it is assumed that the plasma source 6 of FIG. 1 is stopped, the switch 18a of FIG. 2 is opened, the first valve 25 is closed, the second valve 26 is closed, the driving shaft 34A is lowered (the blocking mechanism 30A is in an opened state), and the supply of the high frequency power from the high frequency power source 42 is stopped.

First, the control unit 8 sends a control signal to the switch 18a so as to close the switch 18a. Accordingly, the wafer W is sucked by the electrostatic chuck 16. Subsequently, the control unit 8 sends a control signal to the first valve 25 so as to open the first valve 25. Accordingly, the cooling gas is introduced into the gas storage unit 20A from the outside of the processing chamber 2A through the gas pipe 24, the gas introducing line 23A, and the gas introducing port 22 (an introduction process). The cooling gas introduced into the gas storage unit 20A is supplied to the gap between the wafer W and the top surface of the electrostatic chuck 16 through the connection units 28.

When a required amount of the cooling gas is stored in the gas storage unit 20A, the control unit 8 sends a control signal to the motor for the driving shaft 34A to raise the driving shaft 34A, and sends a control signal to the first valve 25 to close the first valve 25. Accordingly, as illustrated in FIG. 4, the blocking mechanism 30A is in a closed state, and introduction of the cooling gas from the outside of the processing chamber 2A is stopped (a blocking process). Subsequently, the control unit 8 sends a control signal to the second valve 26 to open the second valve 26. Accordingly, the cooling gas is exhausted from the gas introducing line 23A and the gas pipe 24 to the vacuum pump 27.

When the exhaust is sufficiently performed, the control unit 8 performs a recipe to send control signals to the plasma source 6 and the high frequency power source 42, respectively. Accordingly, the plasma source 6 generates plasma in the processing space. The high frequency power source 42 applies a high frequency voltage between the reference electrode and the base 14A to draw the plasma generated by the plasma source 6 to the wafer W. At the predetermined plasma processing, since the metal contact plate 36A comes in contact with the metal seal 38 to confine the cooling gas within the base 14A, the entirety of the cooling gas is kept at the same potential as the base 14A. Accordingly, in the cooling gas space defined by the gas storage unit 20A, no potential difference occurs, and abnormal discharge may be sufficiently suppressed in the cooling gas space.

When the predetermined plasma processing is completed, the control unit 8 finishes the recipe, and sends control signals to the plasma source 6 and the high frequency power source 42, respectively. Accordingly, the plasma source 6 stops generation of the plasma. The high frequency power source 42 stops supplying of the high frequency power. Subsequently, when an additional plasma processing is performed, the control unit 8 sends a control signal to the second valve 26 to close the second valve 26, and sends a control signal to the first valve 25 to open the first valve 25. Accordingly, the gas introducing line 23A and the gas pipe 24 are charged with the cooling gas. Subsequently, the control unit 8 sends a control signal to the motor for the driving shaft 34A so as to lower the driving shaft 34A. Accordingly, as illustrated in FIG. 3, the blocking mechanism 30A is placed in an opened state again, and the cooling gas is introduced into the gas storage unit 20A (an introduction process). Thereafter, the processing is repeated.

When the wafer W is taken out after the predetermined plasma processing is completed, the control unit 8 sends a control signal to the switch 18a so as to open the switch 18a. Accordingly, the wafer W is released from the electrostatic chuck 16 and may be taken out. The processing may be repeated without stopping the plasma source 6.

As described above, the plasma processing apparatus 1A includes the high frequency power source 42 connected between the reference electrode GND and the base 14A, the gas storage unit 20A provided within the base 14A to store the cooling gas, the blocking mechanism 30A configured to block the gas introducing port 22 of the gas storage unit 20A, and the connection units 28 configured to connect the space between the disposition position of the wafer W and the electrostatic chuck 16 to the gas storage unit 20A.

According to the plasma processing apparatus 1A, the gas introducing port 22 of the gas storage unit 20A is blocked by the blocking mechanism 30A to confine the cooling gas within the base 14A. The blocking mechanism 30A includes the sealing valve 32A having the metal contact plate 36A on the top surface thereof. When the blocking mechanism 30A is in a closed state, the metal contact plate 36A comes in a metal touch with the metal seal 38 provided around the gas introducing port 22. Accordingly, even when the base 14A becomes an RF-HOT portion by a high frequency voltage applied to the base 14A, the entirety of the cooling gas is confined within the RF-HOT portion and kept at the same potential as the base 14A. As described above, in the cooling gas space defined by the gas storage unit 20A, any portion of the RF-HOT portion does not face the GND portion, and no potential difference occurs, and thus an abnormal discharge may be sufficiently suppressed in the cooling gas space.

The plasma processing apparatus 1A further includes the control unit 8. The control unit 8 introduces the cooling gas into the gas storage unit 20A when a high frequency voltage is not applied between the reference electrode GND and the base 14A by the high frequency power source 42. When the blocking mechanism 30A is in an opened state, in a series of cooling gas spaces defined by, for example, the gas storage unit 20A and the gas introducing line 23A, the base 14A faces the processing chamber 2A as the reference electrode. Accordingly, when the high frequency voltage is not applied, the blocking mechanism 30A is in an opened state to introduce the cooling gas into the gas storage unit 20A. Thus, the abnormal discharge may be sufficiently suppressed in the cooling gas space.

The plasma processing method of the first exemplary embodiment includes an introduction process and a blocking process. In the introduction process, when the high frequency voltage is not applied between the reference electrode GND and the base 14A by the high frequency power source 42, the cooling gas is introduced into the gas storage unit 20A provided within the base 14A and connected to the space between the disposition position of the wafer W and the electrostatic chuck 16. In the blocking process, when the high frequency voltage is applied between the reference electrode and the base 14A by the high frequency power source 42, the gas introducing port 22 of the gas storage unit 20A is blocked.

According to the plasma processing method, when the high frequency voltage is not applied between the reference electrode and the base 14A, the cooling gas is introduced into the gas storage unit 20A, and when the high frequency voltage is applied between the reference electrode and the base 14A, the gas introducing port 22 of the gas storage unit 20A is blocked to confine the cooling gas within the base 14A. Accordingly, even when the high frequency voltage is applied, the entirety of the cooling gas is kept at the same potential as the base 14A. As described above, in the cooling gas space, no potential difference occurs, and thus an abnormal discharge may be sufficiently suppressed in the cooling gas space.

Second Exemplary Embodiment

Figure 5:
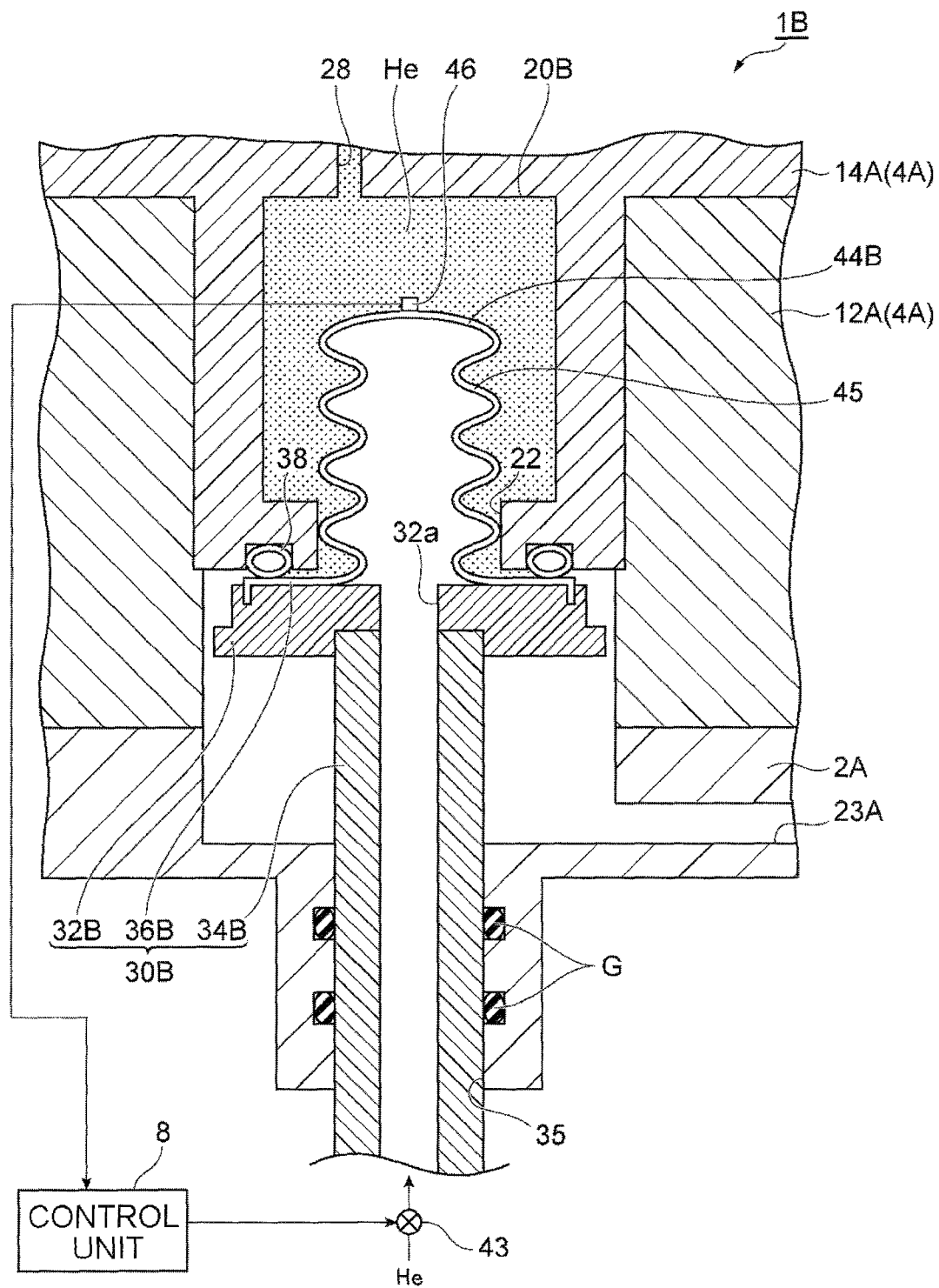
FIG. 5 is a cross-sectional view illustrating a structure in the vicinity of a blocking mechanism in an enlarged scale in a second exemplary embodiment.

Hereinafter, a plasma processing apparatus 1B in the second exemplary embodiment will be described. Devices and operations of the second exemplary embodiment are the same as those in the first exemplary embodiment except for a blocking mechanism and an added pressure fluctuation suppressing mechanism. FIG. 5 is a cross-sectional view illustrating a structure in the vicinity of a blocking mechanism 30B in an enlarged scale in the second exemplary embodiment. In FIG. 5, the connection relationship between the control unit 8 and respective units, which is illustrated in FIG. 2, is omitted. In FIG. 5, the portion where a He gas is present is illustrated with hatching.

A gas storage unit 20B includes a pressure fluctuation suppressing mechanism (unit) 44B therein. The pressure fluctuation suppressing mechanism 44B is formed to be integrated with a metal contact plate 36B, at the center of the metal contact plate 36B provided on a sealing valve 32B of a blocking mechanism 30B. The pressure fluctuation suppressing mechanism 44B is formed in a substantially cylindrical bellows shape with a closed upper portion. The pressure fluctuation suppressing mechanism 44B is continued to the central portion of the metal contact plate 36B, and the bottom portion of the pressure fluctuation suppressing mechanism 44B is opened. A bellows 45 which vertically expands and contracts is formed at the side surface of the cylinder. The pressure fluctuation suppressing mechanism 44B is capable of being elastically deformed by the expansion and contraction of the bellows 45. The radius of the cylinder is smaller than the aperture of the gas introducing port 22. Thus, the pressure fluctuation suppressing mechanism 44B may be elastically deformed by the expansion and contraction of the bellows 45 to enter the inside of the gas storage unit 20B through the gas introducing port 22. A pressure sensor 46 configured to monitor the pressure within the gas storage unit 20B is provided at the distal end of the pressure fluctuation suppressing mechanism 44B. The pressure sensor 46 is connected to the control unit 8 to send pressure information to the control unit 8.

A driving shaft 34B of the blocking mechanism 30B is a tubular member having a cavity therein, in which, for example, a gas flows. The pressure within the tube may be adjusted by a third valve 43. The third valve 43 is connected to the control unit 8. The opening and closing of the third valve 43 is controlled by a control signal from the control unit 8. The sealing valve 32B has a through hole 32a formed in the central portion thereof. By the through hole 32a, the inside of the driving shaft 34B and the inside of the cylinder of the pressure fluctuation suppressing mechanism 44B can be communicated with each other.

Since the sealing between the electrostatic chuck 16 and the wafer W is not complete, the cooling gas within the gas storage unit 20B is gradually leaked. Accordingly, when the blocking mechanism 30B is in a closed state, the pressure of the cooling gas within the gas storage unit 20B is reduced. In the plasma processing apparatus 1B, the control unit 8 receives pressure information from the pressure sensor 46 to detect the reduction of the pressure. When detecting the reduction of the pressure, the control unit 8 sends the control signal to the third valve 43. Accordingly, for example, a He gas is supplied into the pressure fluctuation suppressing mechanism 44B through the cavity in the driving shaft 34B. The He gas supplied into the pressure fluctuation suppressing mechanism 44B has such a high pressure that no discharge is possible. In the control of the pressure fluctuation suppressing mechanism 44B, other media such as, for example, a mechanical actuator may be used than the He gas. The raising and lowering operation of the blocking mechanism 30B is the same as that of the blocking mechanism 30A.

In the pressure fluctuation suppressing mechanism 44B, the bellows 45 is expanded and contracted by the supply of the He gas to adjust the volume of the gas storage unit 20B. The pressure fluctuation suppressing mechanism 44B is deformed to have a volume equivalent to the volume of the leaked cooling gas so that the reduction of the pressure of the cooling gas is suppressed. Accordingly, the pressure fluctuation of the cooling gas within the gas storage unit 20B is suppressed.

As described above, in the plasma processing apparatus 1B, the gas storage unit 20B includes the pressure fluctuation suppressing mechanism 44B configured to suppress the pressure fluctuation of the cooling gas within the gas storage unit 20B. Accordingly, even when the cooling gas is leaked from the space between the wafer W and the electrostatic chuck 16, the pressure of the cooling gas within the gas storage unit 20B may be maintained constantly. Accordingly, the pressure of the cooling gas supplied to the space between the wafer W and the electrostatic chuck 16 may be maintained constantly. Thus, the heat of the wafer W may be effectively transferred to the electrostatic chuck 16, so that a uniform plasma processing may be easily performed.

Third Exemplary Embodiment

Figure 6:
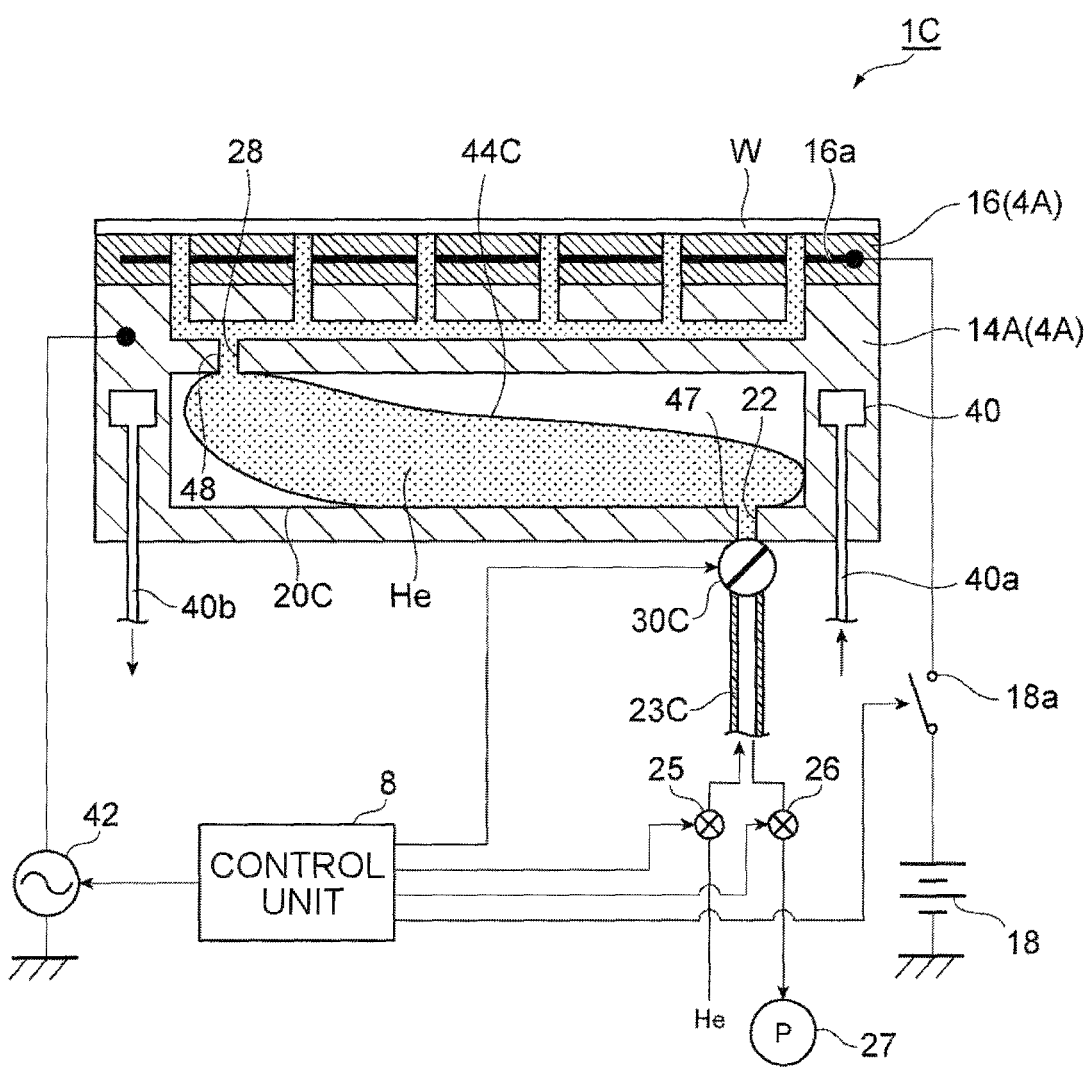
FIG. 6 is a cross-sectional view schematically illustrating a part of a plasma processing apparatus in a third exemplary embodiment.

Hereinafter, a plasma processing apparatus 1C in the third exemplary embodiment will be described. FIG. 6 is a cross-sectional view schematically illustrating a part of a plasma processing apparatus including a base stand in the third exemplary embodiment. In FIG. 6, a holding unit and a processing chamber are omitted. In FIG. 6, the portion where a He gas is present is illustrated with hatching. Devices and operations of the third exemplary embodiment are the same as those in the first exemplary embodiment except for a blocking mechanism 30c, and an added pressure fluctuation suppressing mechanism.

A gas storage unit 20C includes a pressure fluctuation suppressing mechanism 44C therein. The pressure fluctuation suppressing mechanism 44C is a bag-shaped elastic member which stores a cooling gas therein. The pressure fluctuation suppressing mechanism 44C is expanded or contracted like a balloon according to the pressure of the stored cooling gas. The pressure fluctuation suppressing mechanism 44C includes an inlet 47 connected to and communicated with the gas introducing port 22 and an outlet 48 connected to and communicated with the connection unit 28.

The gas introducing port 22 is connected to and communicated with a gas introducing line 23C penetrating the processing chamber 2A and the holding unit 12A illustrated in FIG. 2. The gas introducing line 23C is a dielectric tube. The blocking mechanism 30c is provided at the gas introducing port 22 side of the gas introducing line 23C. The blocking mechanism 30c is a valve and made of a metal which is capable of coming in a metal touch with the base 14A. Even when the base 14A becomes an RF-HOT portion by a high frequency voltage applied to the base 14A, the blocking mechanism 30c may be placed in a closed state so that the entirety of the cooling gas may be confined within the RF-HOT portion. The blocking mechanism 30c is connected to the control unit 8 so that the valve is opened and closed by a control signal sent from the control unit 8.

The blocking mechanism 30c may be a check valve. The check valve is capable of being opened and closed by adjusting the supply amount of the cooling gas in the first valve 25. The gas introducing line 23C may also serve as a support configured to support the base stand 4A, and in this case, the holding unit 12A is unnecessary.

In a closed state of the blocking mechanism 30c, even when the cooling gas is leaked due to the incomplete sealing between the electrostatic chuck 16 and the wafer W, the pressure fluctuation suppressing mechanism 44C may be contracted according to the volume of the stored cooling gas so that the reduction of the pressure of the cooling gas may be suppressed.

As described above, in the plasma processing apparatus 1C, the gas storage unit 20C includes the pressure fluctuation suppressing mechanism 44C configured to suppress the pressure fluctuation of the cooling gas within the gas storage unit 20C. Accordingly, even when the cooling gas is leaked from the space between the wafer W and the electrostatic chuck 16, the pressure fluctuation suppressing mechanism 44C stores a cooling gas therein, and is expanded or contracted like a balloon according to the pressure of the stored cooling gas. Thus, the pressure of the cooling gas supplied to the space between the wafer W and the electrostatic chuck 16 may be maintained constantly. Accordingly, the heat of the wafer W may be effectively transferred to the electrostatic chuck 16, so that a uniform plasma processing may be easily performed.

Fourth Exemplary Embodiment

Figure 7:
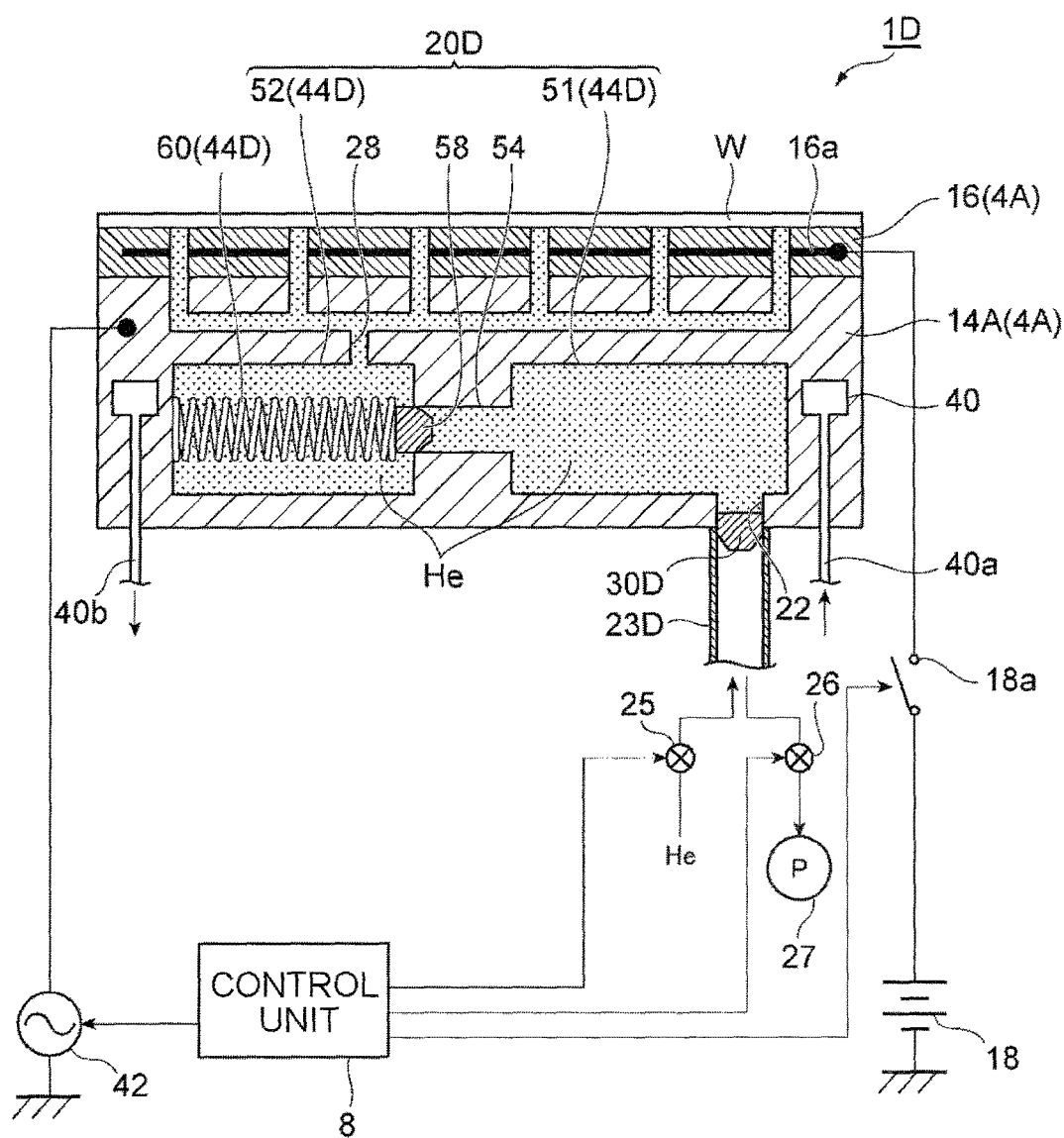
FIG. 7 is a cross-sectional view schematically illustrating a part of a plasma processing apparatus in a fourth exemplary embodiment.

Hereinafter, a plasma processing apparatus 1D in the fourth exemplary embodiment will be described. FIG. 7 is a cross-sectional view schematically illustrating a part of a plasma processing apparatus including a base stand in the fourth exemplary embodiment. In FIG. 7, a holding unit and a processing chamber illustrated in FIG. 2 are omitted. In FIG. 7, the portion where He gas is present is illustrated with hatching. Devices and operations of the fourth exemplary embodiment are the same as those in the first exemplary embodiment except for a blocking mechanism, and an added pressure fluctuation suppressing mechanism.

A gas storage unit 20D has an inside portion divided into a high pressure unit 51 and a low pressure unit 52, and the high pressure unit 51 and the low pressure unit 52 are communicated with each other through a tubular communication passage 54. The high pressure unit 51 is provided at the gas introducing port 22 side, and the low pressure unit 52 is provided at the connection unit 28 side. The pressure within the low pressure unit 52 is suitable for supplying a cooling gas in an appropriate amount to the gap between the wafer W and the top surface of the electrostatic chuck 16 through the connection unit 28. The pressure within the high pressure unit 51 is set to be higher than the pressure within the low pressure unit 52.

The gas introducing port 22 is connected to and communicated with a gas introducing line 23D penetrating the processing chamber 2A and the holding unit 12A illustrated in FIG. 2. The gas introducing line 23D is a dielectric tube. A blocking mechanism 30D is provided at the gas introducing port 22 side of the gas introducing line 23D. The blocking mechanism 30D is a check valve, and suppresses the cooling gas from being leaked from the high pressure unit 51 side to the gas introducing line 23D side.

A valve 58 is provided in the communication passage 54. The valve 58 is connected to one end of a spring 60. The other end of the spring 60 is connected to the low pressure unit 52 side. The spring 60 balances its stretching force with a differential pressure between the pressure within the high pressure unit 51 and the pressure within the low pressure unit 52 to open and close the valve 58.

The blocking mechanism 30D is made of a metal which is capable of coming in a metal touch with the base 14A. Even when the base 14A becomes an RF-HOT portion by a high frequency voltage applied to the base 14A, the blocking mechanism 30D may be placed in a closed state so that the entirety of the cooling gas may be confined within the RF-HOT portion. Also, the blocking mechanism 30D may be a valve made of a metal which is capable of coming in a metal touch with the base 14A. In this case, the blocking mechanism 30D is connected to the control unit 8 and its opening and closing is controlled by the control unit 8. The gas introducing line 23D may also serve as a support configured to support the base stand 4A, and in this case, the holding unit 12A is unnecessary.

In a closed state of the blocking mechanism 30D, when the cooling gas is leaked due to incomplete sealing between the electrostatic chuck 16 and the wafer W, the pressure within the low pressure unit 52 is reduced. Accordingly, the balance between the high pressure unit 51, the low pressure unit 52, and the spring 60 is changed, and the valve 58 is moved to the low pressure unit 52 side and opened. By opening the valve 58, the cooling gas of the high pressure unit 51 flows into the low pressure unit 52, so that the pressure fluctuation within the low pressure unit 52 is suppressed. In this manner, when the high pressure unit 51, the low pressure unit 52, and the spring 60 are balanced, the pressure fluctuation within the low pressure unit 52 is suppressed. That is, the high pressure unit 51, the low pressure unit 52, and the spring 60 constitute a pressure fluctuation suppressing mechanism 44D.

As described above, in the plasma processing apparatus 1D, the gas storage unit 20D includes the pressure fluctuation suppressing mechanism 44D configured to suppress the pressure fluctuation of the cooling gas within the gas storage unit 20D. Accordingly, even when the cooling gas is leaked from the space between the wafer W and the electrostatic chuck 16, the pressure fluctuation suppressing mechanism 44D constituted by the high pressure unit 51, the low pressure unit 52, and the spring 60 is balanced so as to suppress the pressure fluctuation within the low pressure unit 52. Thus, the pressure of the cooling gas supplied to the space between the wafer W and the electrostatic chuck 16 may be maintained constantly. Accordingly, the heat of the wafer W may be effectively transferred to the electrostatic chuck 16 so that a uniform plasma processing may be easily performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a radio frequency (RF) power source connected between a reference electrode and a base stand to apply an RF voltage;
an electrostatic chuck arranged on the base stand;
a gas storage unit configured to store a gas, the gas storage unit being arranged in the base stand and including a gas introducing port;
a blocking mechanism configured to open and close the gas introducing port;
a control unit configured to control the blocking mechanism to open the gas introducing port; and
a connection unit configured to connect the gas storage unit and a space between a substrate set on the electrostatic chuck and the electrostatic chuck, wherein:
the apparatus is configured to introduce the gas into the gas storage unit from an outside gas source through the gas introducing port, and
the control unit is configured to open the gas introducing port when no RF voltage is applied between the reference electrode and the base stand by the RF power source.

2. The plasma processing apparatus of claim 1, wherein the gas storage unit includes a pressure fluctuation suppressing mechanism configured to suppress pressure fluctuation of the gas.

3. The plasma processing apparatus of claim 1, wherein the control unit is configured to control the blocking mechanism to open the gas introducing port to allow the gas to be introduced into the gas storage unit when no RF voltage is applied between the reference electrode and the base stand by the RF power source, and
wherein the control unit is further configured to control the blocking mechanism to close the gas introducing port to stop the gas from being introduced into the gas storage unit when an RF voltage is applied between the reference electrode and the base stand by the RF power source.

4. A plasma processing apparatus, comprising:
a radio frequency (RF) power source connected between a reference electrode and a base stand;
a gas storage unit configured to store a gas, the gas storage unit being arranged in the base stand and including a gas introducing port;
a blocking mechanism configured to open and close the gas introducing port;
a connection unit configured to connect the gas storage unit and a space between a disposition position of a substrate and the base stand; and
a control unit configured, when the substrate is set over the base stand, to: control the blocking mechanism to open the gas introducing port to allow the gas to be introduced into the gas storage unit when no RF voltage is applied between the reference electrode and the base stand by the RF power source, and control the blocking mechanism to close the gas introducing port to stop the gas from being introduced into the gas storage unit when an RF voltage is applied between the reference electrode and the base stand by the RF power source.

* * * * *